United States Patent
Hanna et al.

(10) Patent No.: US 6,414,513 B1
(45) Date of Patent: Jul. 2, 2002

(54) CUSTOMIZED SYSTEM-READABLE HARDWARE/FIRMWARE INTEGRATED CIRCUIT VERSION INFORMATION

(75) Inventors: Stephen Dale Hanna, Longmont; Steven G. Ludwig, Broomfield; Hao That Ton, Denver, all of CO (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/678,699

(22) Filed: Oct. 3, 2000

(51) Int. Cl.⁷ .............................................. H03K 19/177
(52) U.S. Cl. ........................ 326/38; 326/41; 365/230.02
(58) Field of Search ...................................... 326/38–41

(56) References Cited

U.S. PATENT DOCUMENTS

| | | | |
|---|---|---|---|
| 5,022,077 A | | 6/1991 | Bealkowski et al. ............ 380/4 |
| 5,230,052 A | | 7/1993 | Dayan et al. ................ 395/700 |
| 5,347,181 A | | 9/1994 | Ashby et al. ................ 307/465 |
| 5,388,267 A | | 2/1995 | Chan et al. .................. 395/700 |
| 5,572,148 A | * | 11/1996 | Lytle et al. ..................... 326/41 |
| 5,701,477 A | | 12/1997 | Chejlava, Jr. ................ 395/652 |
| 5,938,779 A | | 8/1999 | Preston ......................... 714/718 |
| 5,964,875 A | | 10/1999 | Autor et al. ................. 713/100 |
| 5,974,245 A | | 10/1999 | Li et al. .................. 395/500.11 |
| 5,974,567 A | | 10/1999 | Dickson et al. ............... 714/27 |
| 5,995,740 A | | 11/1999 | Johnson ................. 395/500.41 |
| 6,003,130 A | | 12/1999 | Anderson ....................... 713/2 |
| 6,049,223 A | * | 4/2000 | Lytle et al. ..................... 326/40 |
| 6,094,654 A | | 7/2000 | Huben et al. ................... 707/8 |
| 6,097,211 A | * | 8/2000 | Couts-Martin et al. ........ 326/40 |
| 6,097,988 A | * | 8/2000 | Tobias .......................... 700/23 |
| 6,201,404 B1 | * | 3/2001 | Reddy et al. .................. 326/10 |
| 6,215,326 B1 | * | 4/2001 | Jefferson et al. .............. 326/41 |
| 6,249,143 B1 | * | 6/2001 | Zaveri et al. .................. 326/40 |

* cited by examiner

*Primary Examiner*—Michael Tokar
*Assistant Examiner*—Vibol Tan
(74) *Attorney, Agent, or Firm*—Ohlandt, Greeley, Ruggiero & Perle, L.L.P.; Scott W. Reid

(57) ABSTRACT

An integrated circuit device or chip enables a system interface to read multiple design level/version numbers of multiple and independent version numbers per chip to identify independently modifiable sub-sections of the chip (or module) design. The design enables one to store both creation and modification dates and/or version numbers for each sub-section or partition of the chip design, referred to herein generally as functional units. The values can be hard-coded into the design, such as in the case of an ASIC, or they can be placed in a FPGA download design and stored as part of the FPGA configuration procedure. The values can also be stored from the input pins of the integrated circuit. The readout of the version information can be performed via a hardware trace register readout through a system interface. In this manner one is enabled to implement multiple level control to separate the functional and diagnostic area of the chip.

14 Claims, 3 Drawing Sheets

CUSTOMIZED SYSTEM-READABLE HARDWARE/FIRMWARE INTEGRATED CIRCUIT VERSION INFORMATION

FIELD OF THE INVENTION

This invention relates generally to integrated circuit design and construction methods and apparatus and, more particularly, relates to methods and apparatus for embedding computer-readable design-related version information into an integrated circuit.

BACKGROUND OF THE INVENTION:

A problem has arisen as Application Specific Integrated Circuits (ASICs) and Field Programmable Gate Arrays (FPGAs) have grown in size and complexity. Specifically, conventional practice stores or embeds within the integrated circuit, such as within a trace register, certain design level or version information that pertains to the entire integrated circuit (e.g., Design Level XYZ). This design level or version information can be subsequently read out of the integrated circuit during system test and/or initialization procedures and can be used for, by example, selecting a particular software driver to work with the specific version of the integrated circuit that is present. In other cases integrated circuit test methodologies may be varied (e.g., timing, maximum test frequencies, etc.) based on the indicated version of the integrated circuit under test.

However, newer integrated circuit synthesis and layout programs allow designers to partition or parse their designs on a single chip or module into multiple partitions and then subsequently load them separately. The conventional practice of providing one design level or version per integrated circuit is thus not adequate for tracking the use of such multiple partitions, and inefficiencies can result. As but one example, a design for a particular complex FPGA may contain a plurality of functional units, each of which requires configuration by serial code that is read out from a memory device during system initialization. As may be appreciated, if a particular version of the FPGA is identical to another version except for an enhancement made to one of the functional units, then it would be advantageous to be able to be made aware of which functional unit differs so that the configuration can be efficiently performed.

OBJECTS AND ADVANTAGES OF THE INVENTION

It is a first object and advantage of this invention to provide an improved integrated circuit that stores and outputs system-readable information for separately identifying individual ones of a plurality of integrated circuit functional units.

It is another object and advantage of this invention to provide a programmable integrated circuit having a plurality of functional units, wherein during a trace register readout procedure there is output information that is descriptive of individual ones of the function units, such as a version number for each functional unit, as well as ancillary functional unit information and other information, such as a version number for the integrated circuit as a whole.

SUMMARY OF THE INVENTION

The foregoing and other problems are overcome and the foregoing objects and advantages are realized by methods and apparatus in accordance with embodiments of this invention.

An integrated circuit device or chip enables a system interface to read multiple design level/version numbers of multiple and independent version numbers per chip to identify independently modifiable sub-sections of the chip (or module) design. The design enables one to store both creation and modification dates and/or version numbers for each sub-section or partition of the chip design, referred to herein generally as functional units. The values can be hard-coded into the design, such as in the case of an ASIC, or they can be placed in a FPGA download design and stored as part of the FPGA configuration procedure. The values can also be stored from the input pins of the integrated circuit. The readout of the version information can be performed via a hardware trace register readout through a system interface. In this manner one is enabled to implement multiple level control to separate the functional and diagnostic area of the chip.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
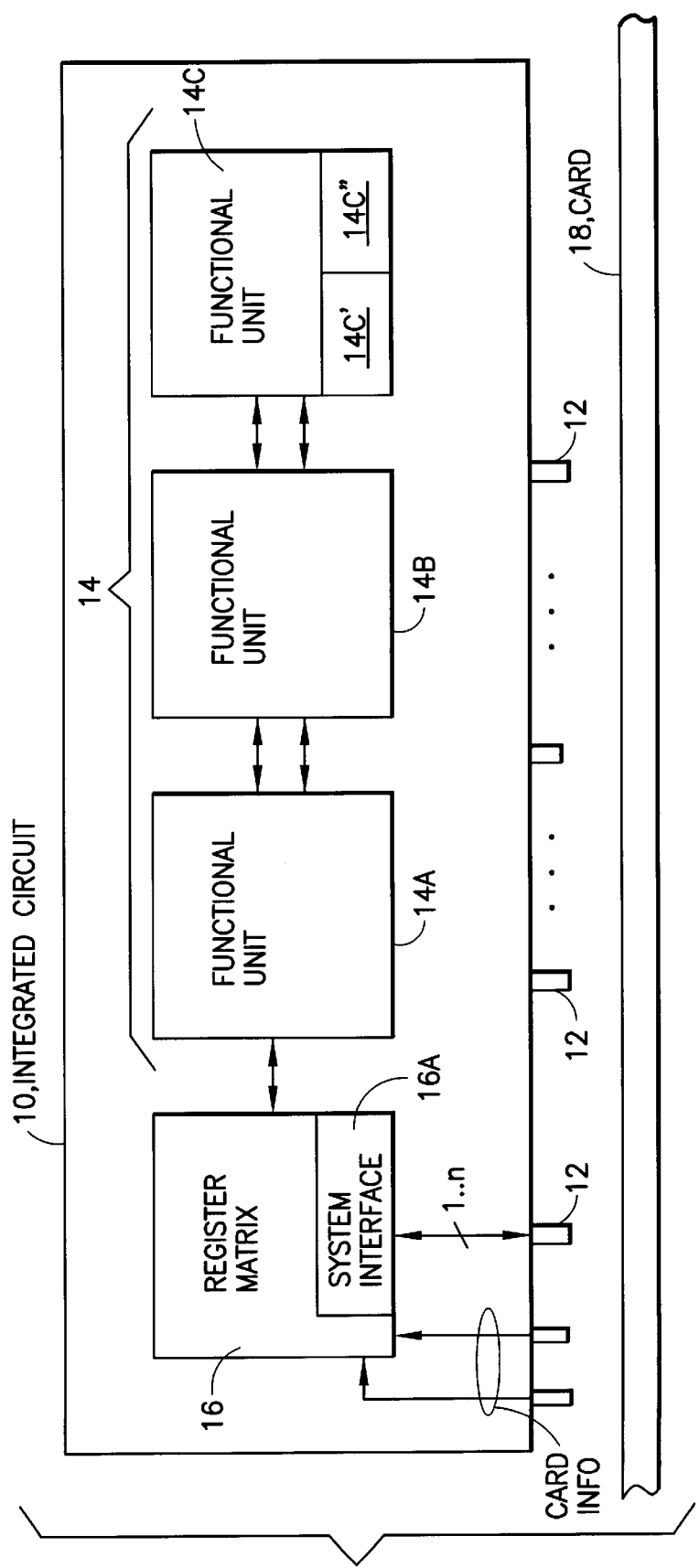
FIG. 1 is block diagram of an integrated circuit in accordance with the teachings of this invention.

FIG. 1 illustrates in block diagram form an integrated circuit (IC) 10 that is constructed in accordance with the teachings of this invention. The IC 10 may be an ASIC or a FPGA, or it may be another type of integrated circuit, such as a microprocessor or a communications device. In any case, the IC 10 includes a plurality of input/output (I/O) pins 12, at least one of which is used to read out identification information that is descriptive of individual ones of a plurality of functional units 14. In the illustrated example there are three functional units 14A, 14B and 14C, although there may be more or less than this number. By example only, one of the functional units 14A contains circuitry that implements a microprocessor core function, a second functional unit 14B contains circuitry that implements a memory management function, while the third functional unit contains circuitry that implements a parallel data communications function. In another embodiment the functional units 14 may be partitioned between the logic that implements the desired functionality of the integrated circuit (also referred to herein as an "operations unit" or units), and other logic that implements a diagnostic functionality of the integrated circuit. The functional units 14 may each be interconnected by wiring within the IC 10 so as to operate together, or one or more of them may "stand-alone" and operate independently of the others. It should be further noted that a given functional unit can be partitioned into sub-functional units, such as the sub-functional units 14C' and 14C" that form a part of the parallel data communications functional unit 14C. In the illustrated example all of the functional units 14 are integrated onto the same wafer, although in other embodiments of this invention the IC 10 may actually be a module that contains a plurality of discrete functional unit devices that are mounted to a substrate and interconnected via wire bonds and the like.

The functional units 14 may be physical functional units or logical functional units. For example, in the first case localized regions of the IC 10 contain circuitry that is permanently configured for executing a certain task, either through design and chip fabrication or through some later operation, such as in a fuse-programmable ASIC (all of which are considered herein to be "hardwired"). In the latter case each of the localized regions of the IC 10 may be configured into a functional unit by providing suitable configuration data and instructions, such as occurs when a FPGA is initialized and programmed for operation. The teachings of this invention apply to integrated circuits 10 having both types of functional units 14, as well as to integrated circuits having a mix of physical (hardwired) and logical functional units 14.

The IC 10 also includes a register matrix or array 16, for example a 128 register matrix. The register matrix 16 can be used to store diagnostic information such as error flags and error codes, as well as certain system state information. In conventional practice the register matrix 16 also stores the version identification information for the entire IC 10.

As an example of the utility of this invention, and assuming that the IC 10 is installed on a pc board or card 18, the following information can be stored in the register array 16:

(A) Version number for entire IC 10

(B) Date and time (created/modified) for entire IC 10

(C) Card 18 design level (programmed via hardwired inputs to the IC 10)

(D) In accordance with the teachings of this invention, a version number for each design partition or functional unit 14 (such as operations and diagnostic partitions)

(E) Further in accordance with the teachings of this invention, creation/change dates for each functional unit 14

As integrated circuits become larger and more complex, the foregoing information can be replaced or supplemented with the following (ancillary) information:

(F) Machine-readable part numbers for each configuration code level (e.g., FPGA)

(G) Version level descriptions (in ASCII for example)

(H) Comments of various types and other information, such as the name of the designer(s)

It should be appreciated that the foregoing lists of information are not intended to be exhaustive, but are merely exemplary of the various types of information that can be stored within the IC 10 for subsequent readout through a system interface 16A to an external agent, such as a data processor, that will make some use of the information.

The functional unit-related information that is stored in the register array 16 can be hard-coded into the register array 16, such as during the gate definition and design process of an ASIC, or it can be subsequently loaded and stored into the register array 16, such as during the configuration or set-up procedure of a FPGA. As was mentioned, some of the information may be derived through pins of the integrated circuit 10, such as by being hard-wired into the socket location of the integrated circuit 10 on the card 18.

Figure 2:
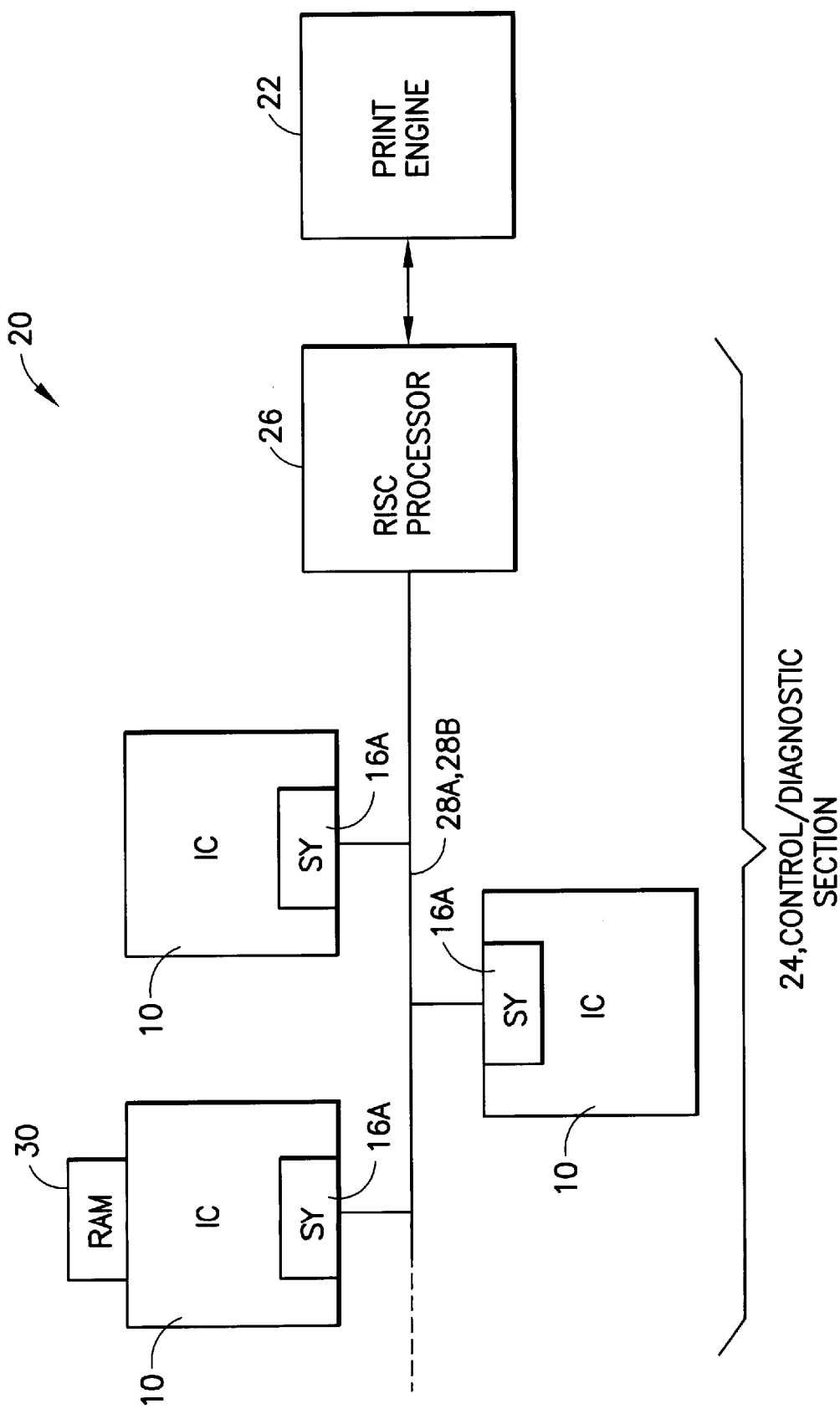
FIG. 2 depicts a plurality of integrated circuits constructed in accordance with these teachings when installed within an electronics system, specifically a printer.

FIG. 2 depicts an electronic system, in this example a printer 20, that is constructed so as to include a plurality of integrated circuits 10 that are designed and operated in accordance with the teachings of this invention. In this embodiment the integrated circuits 10 are FPGAs, although in other embodiments one or more of them could be ASICs or some other type of integrated circuit. The printer includes a print engine 22 and a control/diagnostic section 24 that includes a data processor, such as a RISC processor 26 that is interconnected with the integrated circuits 10 over a bus 28. The bus 28 is assumed for this embodiment to include an I/O bus portion 28A as well as a diagnostic bus portion 28B. A RAM memory 30 is provided for storing configuration code for at least one of the integrated circuits 10, while the remaining ones are programmed from the RISC processor 26. The configuration code in this case contains the version information that is stored into the register matrix or array 16, as well as some or all of the various types of information that were listed above.

During operation of the printer 20 the RISC processor 26 will periodically readout the register array 16 of one or more of the integrated circuits 10 over the diagnostic bus 28B via the system interfaces 16A of individual ones of the integrated circuits 10. By thus reading out the register array 16 the RISC processor 26 obtains, along with other data stored in the register array 16, the integrated circuit 10 version level and card identification information, as well as the version level and other information (e.g., date and optionally time last modified) for the integrated circuit 10 being readout.

Figure 3:
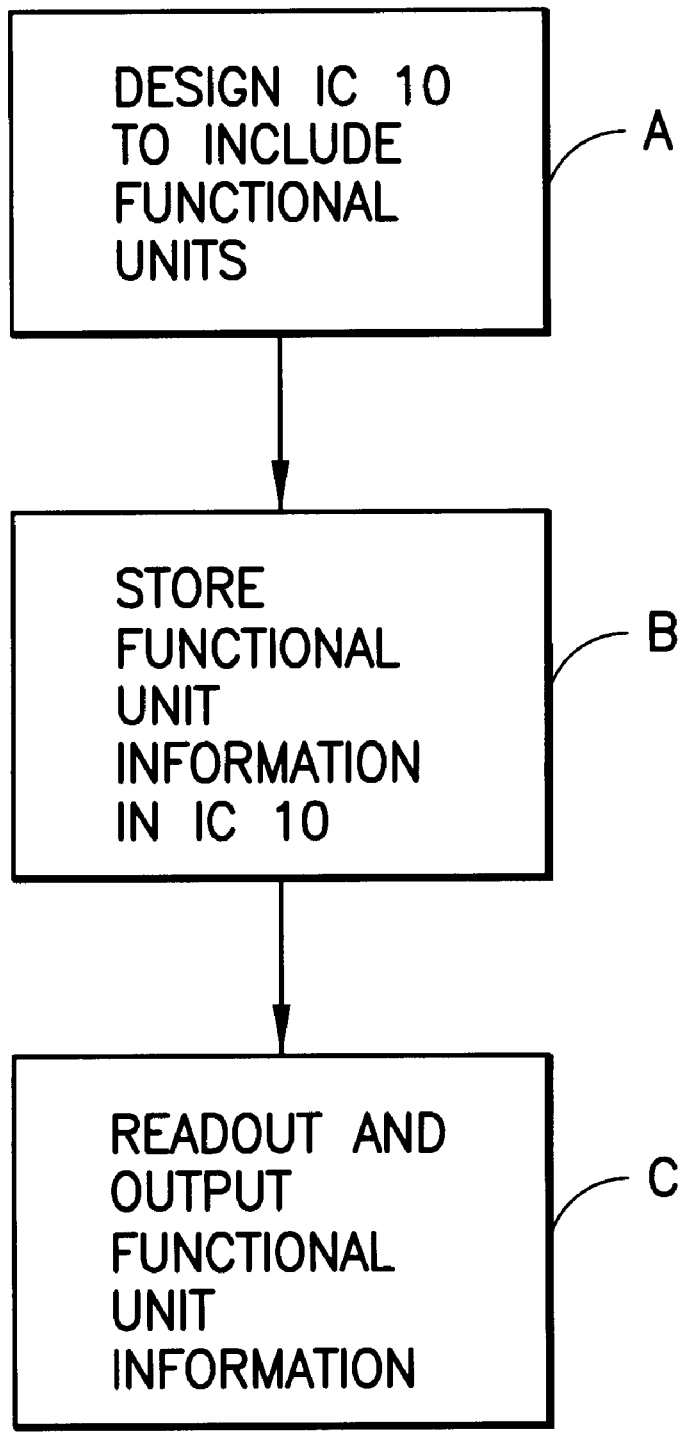
FIG. 3 is a logic flow diagram that shows steps of a method in accordance with these teachings.

FIG. 3 is a logic flow diagram in accordance with a method of this invention, specifically a method for obtaining information concerning an integrated circuit. The method includes steps of (A) designing the integrated circuit so as to comprise a plurality of functional units 14 and a storage device, such as the register array 16; (B) storing information within the storage device that is descriptive of individual ones of said function units, where the information can be stored by being hardwired or stored along with configuration data; and (C) during operation of the integrated circuit 10, reading out the functional unit information stored in the storage device and outputting the information from the integrated circuit 10. The functional units 14 may be designed so as to be partitioned between at least one operations unit and at least one diagnostic unit.

In the preferred embodiment the storage device further stores information that is descriptive of the integrated circuit as a whole, and also information that is descriptive at least in part of a version of each of the functional units, and optionally information that is descriptive at least in part of when the functional units were created and/or last modified. For the case where the integrated circuit 10 is designed to be programmable using configuration data, the storage device is loaded with the information from the configuration data.

An aspect of this invention is providing a computer readable data storage medium, such as the register array 16, for storing data that is descriptive at least in part of individual ones of the plurality of functional units 14 that are contained within the integrated circuit 10, where the data is descriptive at least in part of at least one of a version of each of the plurality of functional units, of when individual ones of the plurality of functional units were created, and of when individual ones of the plurality of functional units were last modified. The individual ones of the plurality of functional units 14 are one of hardwired or configurable, and for the case of configurable functional units the data that is stored into the data storage medium is readout from another data storage medium that stores configuration data, such as the RAM 30.

While the invention has been particularly shown and described with respect to preferred embodiments thereof, it will be understood by those skilled in the art that changes in form and details may be made therein without departing from the scope and spirit of the invention.

What is claimed is:

1. An integrated circuit, comprising:

a plurality of functional units;

a data storage device for storing information that is descriptive of a member of said plurality of functional units; and an interface coupled between said data storage device and an external terminal of said integrated circuit for enabling said information from said data storage device to be output from said integrated circuit, wherein said information is selected from the group consisting of (a) an identifier of said member, (b) a version of said member, (c) when said member was created, (d) when said member was last modified, (e) a configuration code of said member, (f) a comment relating to said member, (g) a designation of a designer of said member, and (h) a design level of a card with which said integrated circuit is associated.

2. An integrated circuit as in claim 1, wherein said data storage device is comprised of registers, and wherein said functional units are partitioned between at least one operations unit and at least one diagnostic unit.

3. An integrated circuit as in claim 1, wherein said data storage device further stores information that is descriptive of said integrated circuit as a whole.

4. An integrated circuit as in claim 1, wherein said integrated circuit is programmable using configuration data, and wherein said information is descriptive at least in part of a version of the configuration data for each of the functional units.

5. An integrated circuit as in claim 1, wherein said integrated circuit is programmable using configuration data, and wherein said information is descriptive at least in part of when the configuration data for each of the functional units was created.

6. An integrated circuit as in claim 1, wherein said integrated circuit is programmable using configuration data, and wherein said information is descriptive at least in part of when the configuration data for each of the functional units was last modified.

7. A method for obtaining information concerning an integrated circuit, comprising steps of:

designing said integrated circuit so as to comprise a plurality of functional units and a storage device;

storing information within said storage device that is descriptive of a member of said plurality of functional units; and during operation of said integrated circuit, reading out said information and outputting said information from said integrated circuit, wherein said information is selected from the group consisting of (a) an identifier of said member, (b) a version of said member, (c) when said member was created, (d) when said member was last modified, (e) a configuration code of said member, (f) a comment relating to said member, (g) a designation of a designer of said member, and (h) a design level of a card with which said integrated circuit is associated.

8. A method as in claim 7, wherein said storage device is designed so as to be comprised of registers, and wherein said functional units are designed so as to be partitioned between at least one operations unit and at least one diagnostic unit.

9. A method as in claim 7, wherein said storage device further stores information that is descriptive of said integrated circuit as a whole.

10. A method as in claim 7, wherein said integrated circuit is designed to be programmable using configuration data, and wherein said information is descriptive at least in part of a version of the configuration data for each of the functional units.

11. A method as in claim 7, wherein said integrated circuit is designed to be programmable using configuration data, and wherein said information is descriptive at least in part of when the configuration data for each of the functional units was created.

12. A method as in claim 7, wherein said integrated circuit is designed to be programmable using configuration data, and wherein said information is descriptive at least in part of when the configuration data for each of the functional units was last modified.

13. A computer readable data storage medium storing data that is descriptive at least in part of individual ones of a plurality of functional units that comprise an integrated circuit device, wherein said data is descriptive at least in part of at least one of a version of each of said plurality of functional units, of when individual ones of said plurality of functional units were created, and of when individual ones of said plurality of functional units were last modified.

14. A computer readable data storage medium as in claim 13, wherein individual ones of said plurality of functional units are one of hardwired or configurable, and wherein for the case of configurable functional units said data that is stored into said data storage medium is readout from another data storage medium that stores configuration data.

* * * * *